United States Patent [19]
Banks et al.

[11] Patent Number: 5,316,080
[45] Date of Patent: * May 31, 1994

[54] HEAT TRANSFER DEVICE

[75] Inventors: Bruce A. Banks, Olmsted Township, Cuyahoga County; James R. Gaier, Strongsville, both of Ohio

[73] Assignee: The United States of America as represented by the Administrator of the National Aeronautics & Space Administration, Washington, D.C.

[*] Notice: The portion of the term of this patent subsequent to Jun. 29, 2010 has been disclaimed.

[21] Appl. No.: 17,402

[22] Filed: Feb. 10, 1993

Related U.S. Application Data

[60] Division of Ser. No. 880,951, May 11, 1992, Pat. No. 5,224,030, which is a division of Ser. No. 657,238, Feb. 19, 1991, abandoned, which is a continuation-in-part of Ser. No. 501,893, Mar. 30, 1990, abandoned.

[51] Int. Cl.$^5$ ............................ F28F 7/00; H05K 7/20
[52] U.S. Cl. .................................... 165/185; 257/720; 361/704; 361/707; 361/713
[58] Field of Search ........................ 165/185; 257/720; 361/386, 388, 713

[56] References Cited

U.S. PATENT DOCUMENTS

| | | | |
|---|---|---|---|
| 3,543,842 | 12/1970 | Merges | 165/185 X |
| 3,609,992 | 10/1971 | Cacheux | 165/185 |
| 3,969,754 | 7/1976 | Kuniya et al. | 357/65 |
| 4,161,747 | 7/1979 | Jennings | 257/716 |
| 4,318,954 | 3/1982 | Jensen | 428/209 |
| 4,415,025 | 11/1983 | Horvath | 165/185 |
| 4,470,063 | 9/1984 | Arakawa et al. | 357/67 |
| 4,482,912 | 11/1984 | Chiba et al. | 357/67 |
| 4,485,429 | 11/1984 | Mittal | 361/386 |
| 4,591,659 | 5/1986 | Leibowitz | 174/64.8 |
| 4,630,174 | 12/1986 | Kaufman | 361/713 X |
| 4,749,514 | 6/1988 | Murakami et al. | 252/500 |
| 4,816,289 | 3/1989 | Komatsu et al. | 423/447.3 |
| 4,849,858 | 7/1989 | Grapes et al. | 361/388 |
| 4,867,235 | 9/1989 | Grapes et al. | 165/185 |
| 4,933,804 | 6/1990 | Bertenshaw et al. | 361/713 X |
| 4,985,805 | 1/1991 | Riedel et al. | 361/386 |
| 5,077,637 | 12/1991 | Martorana et al. | 361/386 |
| 5,212,625 | 5/1993 | Van Andel et al. | 361/383 |
| 5,224,030 | 6/1993 | Banks et al. | 361/386 |

FOREIGN PATENT DOCUMENTS

| | | | |
|---|---|---|---|
| 0296613 | 12/1988 | European Pat. Off. | 423/447.7 |
| 98756 | 5/1987 | Japan | 257/720 |
| 308559 | 12/1990 | Japan | 257/720 |

OTHER PUBLICATIONS

Ciancanelli, J. M. "Circuit Module with Heat Transfer", IBM Tech. Discl. Bull., vol. 19, No. 7, p. 2652, Dec. 1976.

"Thermal Conductivity"—Carbon Fibers; Ching-Cheh Hung, Carbon vol. 25, No. 5, pp. 679-684, Feb. 1987.

*Primary Examiner*—John Rivell
*Assistant Examiner*—L. R. Leo
*Attorney, Agent, or Firm*—Gene E. Shook; Guy M. Miller; James A. Mackin

[57] ABSTRACT

Gas derived graphite fibers generated by the decomposition of an organic gas are joined with a suitable binder. This produces a high thermal conductivity composite material which passively conducts heat from a source, such as a semiconductor, to a heat sink.

The fibers may be intercalated. The intercalate can be halogen or halide salt, alkaline metal, or any other species which contributes to the electrical conductivity improvement of the graphite fiber.

The fibers are bundled and joined with a suitable binder to form a high thermal conductivity composite material device. The heat transfer device may also be made of intercalated highly oriented pyrolytic graphite and machined, rather than made of fibers.

2 Claims, 3 Drawing Sheets

HEAT TRANSFER DEVICE

ORIGIN OF THE INVENTION

The invention described herein was made by employees of the United States Government and may be manufactured and used by or for the Government for governmental purposes without the payment of any royalties thereon or therefor.

STATEMENT OF COPENDENCY

This application is a division of application Ser. No. 880,951 which was filed May 11, 1992, and issued as U.S. Pat. No. 5,224,030 which is a division of application Ser. No. 657,238 which was filed Feb. 19, 1991, and now abandoned, which is a continuation-in-part of application Ser. No. 501,893 which was filed Mar. 30, 1990, and now abandoned.

TECHNICAL FIELD

This invention is concerned with providing an improved heat transfer device. The invention is particularly directed to an apparatus which will transfer heat more efficiently.

Previous devices for transferring heat relied on high thermal conductivity materials. Some of these devices use class II A diamond which conducts heat approximately five times the rate of copper at room temperature. However, such high thermal conductivity materials, such as class II A diamond, are suitable only for short distance heat transport because of the expense of the high quality diamond. Only a short distance transport, on the order of 5 mm, is practical with such materials.

Heat transfer devices of copper, aluminum, silver, and beryllium oxide have been proposed. While these materials can be used to transport heat over larger distances, their poor thermal conductivity requires high temperature gradients to transport the same power per unit area as diamond.

Heat pipes can be very effective transporters of heat with low temperature gradients. However, they rely on some active working fluid and usually have a rather limited temperature range of operation. Heat pipes are not readily constructed in arbitrarily small or complex shapes.

It is, therefor, an object of the present invention to provide a heat transfer device which conducts heat substantially better than conventional devices, yet is lightweight and strong.

Another object of the invention is to provide a heat conducting apparatus which can be used instead of more complex heat pipes and thus, be mechanically supportive, lightweight, and have no active working fluid to be concerned about. However, the apparatus will efficiently transfer heat from one place to another.

BACKGROUND ART

U.S. Pat. No. 2,542,637 to De Poy is concerned with a method of rectifying a neutral salt heat-treating bath. A solid graphite or carbon rod is immersed in the bath to reduce metal oxides and scavenge for metals in solution. The rod may be periodically removed, cleansed, and replaced.

U.S. Pat. No. 4,424,145 to Sara relates to a pitch derived carbon fiber which has been boronated and intercalated with calcium. U.S. Pat. No. 4,435,375 to Tamura is directed to a graphite filament which has been formed by heating a purified graphite material in a plasma and then intercalated with an alkali metal.

U.S. Pat. No. 3,531,249 to Turkat describes pyrolytic graphite compositions which are formed by codepositing refractory metals and graphite on a mandrel to form a filament which is in essence pyrolytic graphite. U.S. Pat. No. 3,294,880 which is also to Turkat describes a continuous method of manufacturing ablative and refractory materials. The invention is particularly concerned with a method and apparatus for manufacturing ablative and refractory filaments in which hydrocarbon gases are cracked in a vacuum furnace. The decomposition products are deposited on a rotating mandrel and then continuously peeled therefrom in the form of a continuous filament. U.S. Pat. No. 3,375,308 which is likewise issued to Turkat is concerned with the making of high purity and non-melting filaments. High temperature, high strength ablative refractory materials, such as pyrolytic graphite, are produced by vapor decomposition and hydrocarbon gas cracking techniques to provide pure crystalline refractory metals, carbides, silicides and borides in free standing shapes, coatings and in compositions to form shapes and structures for space age applications.

DISCLOSURE OF THE INVENTION

Gas derived graphite fibers joined with a suitable binder are used to make a high thermal conductivity composite material device. The fiber is generated by the decomposition of an organic gas.

The fibers may or may not be intercalated. The intercalate can be a halogen or halide salt, alkaline metal, or any other species which contributes to the electrical conductivity improvement of the graphite fiber.

The fibers are then bundled and joined with a suitable binder resulting in a high thermal conductivity composite material device. The heat transfer device may also be made of intercalated highly oriented pyrolytic graphite and machined, rather than made of fibers.

BRIEF DESCRIPTION OF THE DRAWINGS

The objects, advantages, and novel features of the invention will be more fully apparent from the following detailed description when read in connection with the accompanying drawings in which.

BEST MODE FOR CARRYING OUT OF THE INVENTION

Figure 1:
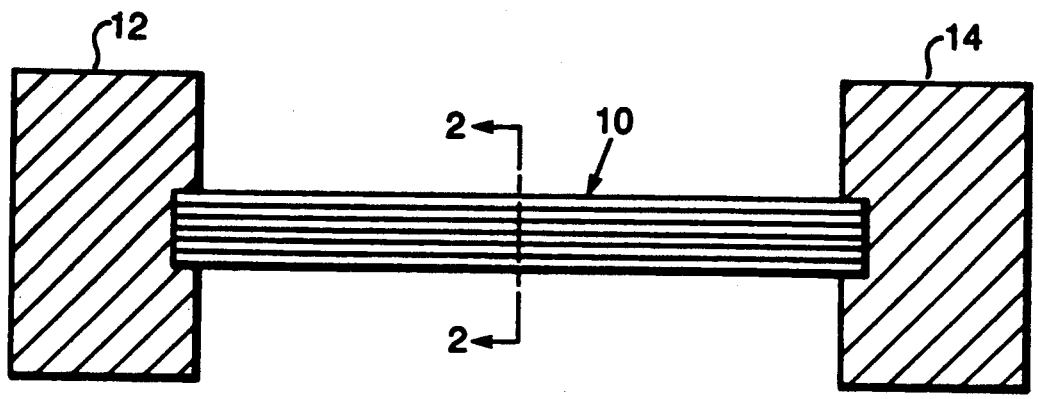
FIG. 1 is an elevation view showing a heat transfer device constructed in accordance with the present invention.

Referring now to the drawing, there is shown in FIG. 1 a heat transfer device 10 constructed in accordance with the present invention. This apparatus is used to conduct heat from heat source 12 to a heat sink 14. The source 12 and the sink 14 are constructed of highly conductive materials while the heat transfer device 10 is a graphite fiber composite composed of either intercalated or heat treated fibers.

Figure 2:
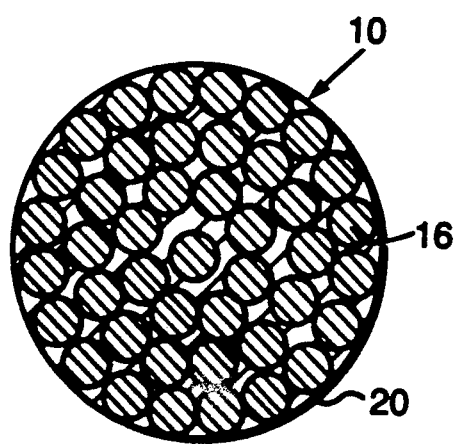
FIG. 2 is a section view taken along the line 2—2 in FIG. 1.
Figure 3:
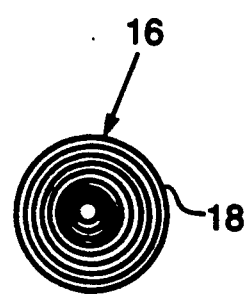
FIG. 3 is an enlarged cross-section view of one of the fibers shown in FIG. 2.

As best shown in FIG. 2 the heat transfer device 10 is made up of highly oriented graphite fibers 16 which may in addition have been intercalated. As shown in FIG. 3, each fiber is a coaxial layered graphite structure which is intercalated with either electron accepter or donor intercalate species. These fibers 16 are constructed into composite material in a form suitable for the specific heat transport application.

Most carbon fibers are produced from one of three types of sources. Fibers formed by the thermal decomposition of polyacrylonitrile are known as PAN fibers. Pitch based fibers are formed by the thermal decomposition of pitch from coal or oil.

The third type is gas derived. These fibers are formed by the decomposition of an organic gas, such as methane, benzene, natural gas, etc. to form carbon fibers. Gas derived fibers possess a different structural configuration lending themselves to much higher thermal conductivities than pitch based fibers or PAN fibers.

The graphite fibers 16 are fabricated by the high temperature decomposition of an organic gas, such as natural gas, benzene, etc. to produce concentric layers 18 of graphite along the fiber axis. The organic gas used to generate the fiber and the conditions under which it is grown can be any number of techniques which produce highly oriented fibers.

These organic gas derived fibers 16 are then heated to 3000° C. to further graphitize and orient them. As a result of this heating, the thermal conductivity of the fibers is increased to about three times that of copper. The high temperature heat treatment and duration can be varied.

The fibers 16 may also be intercalated with a suitable electron donor or acceptor material to further increase the electrical conductivity if enhancement of electrical transport is desired. Intercalation is achieved by the insertion of ions or molecules between the planes or layers 18 of graphite. This is accomplished by surrounding the fibers 16 by vapor of the intercalant at a suitable elevated temperature. The intercalant can be a halogen or halide salt, alkaline metal or any other species which contributes to the thermal conductivity improvement of the graphite fiber.

The pristine or intercalated graphite fibers 16 are then bundled and joined with a suitable binder 20 to produce a high thermal conductivity composite material device 10. While the binder 20 is preferably epoxy or other polymer, it is contemplated that an electrodeposited metal or lowtemperature alloy could be used.

ALTERNATE EMBODIMENTS OF THE INVENTION

Figure 4:
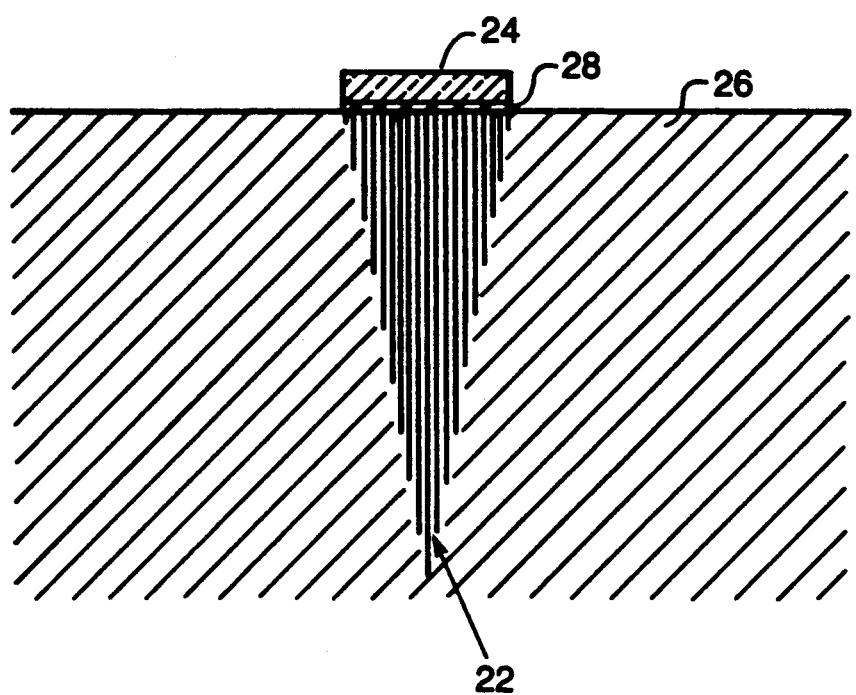
FIG. 4 is a vertical cross-section view showing an alternate embodiment of the invention.

The geometry of the high thermal conductivity composite can be varied as needed to fit specific applications. Referring now to FIG. 4 there is shown an intercalated graphite fiber composite thermal transfer device 22 that is used to cool apparatus which uses a semiconductor 24. More particularly, the heat transfer device 22 is tapered and potted into a tapered slot in a heat sink 26. It is contemplated that the heat sink 26 may be of copper or other highly conductive material. If required, a thin film electrical isolator 28 may be interposed between the semiconductor 24 and the heat sink 26.

Figure 5:
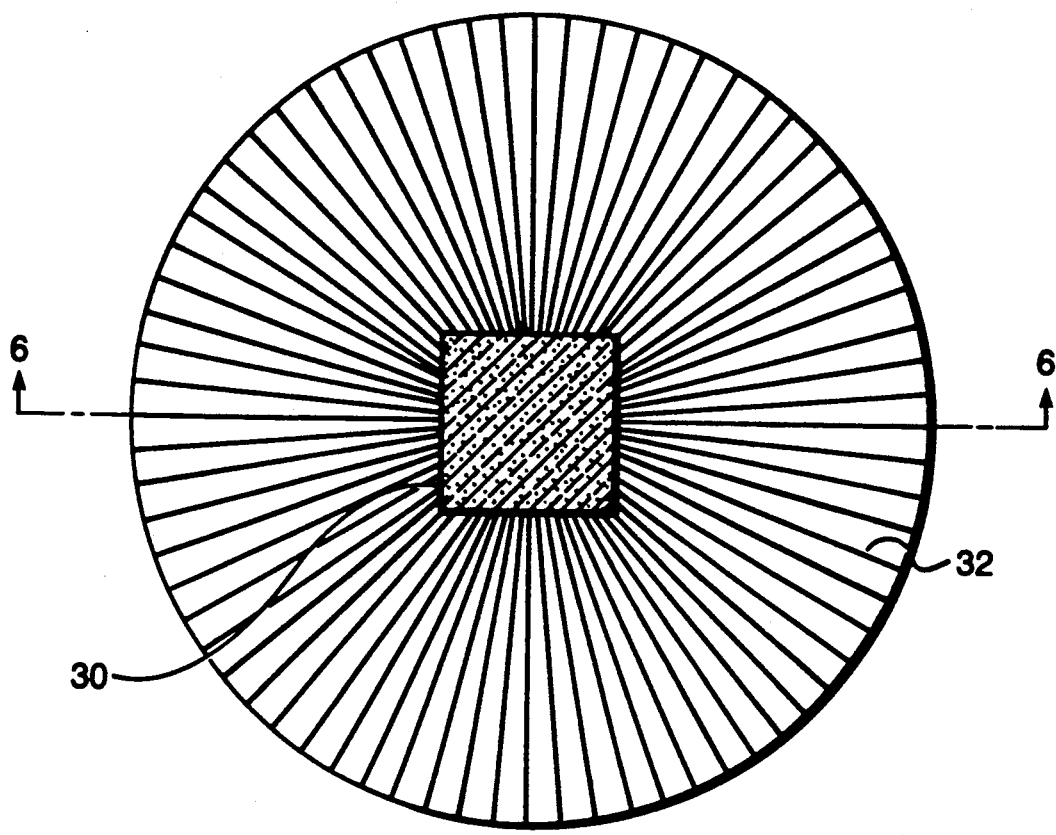
FIG. 5 is a plan view of still another alternate embodiment of the invention.
Figure 6:
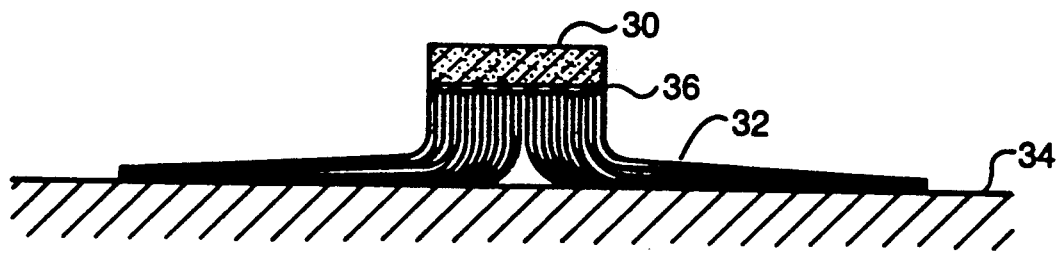
FIG. 6 is a vertical cross-section view taken along the line 6—6 in FIG.5.

The graphite fibers can be sputter vapor, electroless, or electrodeposited with a thin film of metal to allow electrical and/or solder bonding of the fibers to heat sinks. Such a structure is shown in FIGS. 5 and 6 wherein a semiconductor device 30 is cooled by a radial array of intercalated graphite fibers 32 which are in contact with a heat sink 34. If required, a thin film electrical isolator 36 may be interposed between the semiconductor 30 and the heat sink 34. It will be appreciated this configuration facilitates the spreading of semiconductor waste heat by utilizing the intercalated graphite fiber.

The geometry of the high thermal conductivity composite can be varied as needed to fit the specific application. In addition, the heat transfer device may be simply made of intercalated highly oriented pyrolytic graphite and suitably machined rather than being made of fibers.

The intercalated graphite fiber composite material devices shown in the drawings are stronger, lighter and less expensive than other materials of the prior art. Also, these devices have the capability of transferring more heat for the same temperature differential than prior art devices.

Another important advantage of the invention is that the material operates passively. This does not require any transport of a gravitational environment.

While several embodiments of this invention have been shown and described it will be appreciated that various modifications may be made to the disclosed invention without departing from the spirit thereof or the sscope of the subjoined claims.

We claim:

1. A heat transfer device for conducting heat from an element having a first temperature to a copper member having a tapered slot therein and a second temperature lower than said first temperature resulting in a temperature differential comprising
    an intercalated graphite fiber composite having a hot end and a tapered cool end,
    means for mounting said hot end in thermal contact with said element,
    an electrical isolator interposed between said element and said composite, and
    means for potting said tapered cool end in said tapered slot in said member whereby said composite is in thermal contact with said member for optimum heat transfer.

2. A heat transfer device for conducting heat from an element having a first temperature to a member having a second temperature lower than said first temperature resulting in a temperature differential comprising
    an intercalated graphite fiber composite having a hot end and a cool end,
    means for mounting said hot end in thermal contact with said element with the fibers in said composite extending therefrom in a radial array,
    means for mounting an electrical isolator between said element and said composite, and
    means for solder bonding the radially extending fibers in the cool end of said composite to a surface of said member.

* * * * *